United States Patent
Yoon et al.

(10) Patent No.: US 9,385,066 B1
(45) Date of Patent: Jul. 5, 2016

(54) INTEGRATED CIRCUIT PACKAGING SYSTEM WITH MOLDED LASER VIA INTERPOSER AND METHOD OF MANUFACTURE THEREOF

(71) Applicants: In Sang Yoon, Seoul (KR); DeokKyung Yang, Hanam-si (KR); Sungmin Song, Inchon (KR)

(72) Inventors: In Sang Yoon, Seoul (KR); DeokKyung Yang, Hanam-si (KR); Sungmin Song, Inchon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/282,598

(22) Filed: May 20, 2014

Related U.S. Application Data

(62) Division of application No. 13/162,566, filed on Jun. 16, 2011, now Pat. No. 8,765,525.

(51) Int. Cl.
*H01L 23/52* (2006.01)
*H01L 23/48* (2006.01)
*H01L 23/538* (2006.01)

(52) U.S. Cl.
CPC .......... *H01L 23/481* (2013.01); *H01L 23/5385* (2013.01)

(58) Field of Classification Search
CPC .................. H01L 23/481; H01L 23/5385
See application file for complete search history.

(56) References Cited

U.S. PATENT DOCUMENTS

| | | | |
|---|---|---|---|
| 5,973,290 A | 10/1999 | Noddin | |
| 7,084,513 B2 | 8/2006 | Matsuki et al. | |
| 7,185,426 B1 | 3/2007 | Hiner et al. | |
| 7,345,361 B2 | 3/2008 | Mallik et al. | |
| 7,355,274 B2 | 4/2008 | Lim | |
| 7,429,787 B2 | 9/2008 | Karnezos et al. | |
| 7,838,334 B2 | 11/2010 | Yu et al. | |
| 8,110,928 B2 | 2/2012 | Shen et al. | |
| 8,125,092 B2 | 2/2012 | Corisis et al. | |
| 8,188,586 B2 | 5/2012 | Chow et al. | |
| 2005/0001329 A1* | 1/2005 | Matsuki et al. | 257/777 |
| 2010/0032822 A1 | 2/2010 | Liao et al. | |
| 2010/0052148 A1* | 3/2010 | Hsu | H01L 21/563 257/692 |
| 2010/0133675 A1* | 6/2010 | Yu et al. | 257/686 |

\* cited by examiner

*Primary Examiner* — Long Pham
(74) *Attorney, Agent, or Firm* — Wong & Rees LLP

(57) ABSTRACT

A method of manufacture of an integrated packaging system includes: providing a substrate; mounting an integrated circuit on the substrate; mounting an interposer substrate having an interposer pad on the integrated circuit; covering an encapsulant over the integrated circuit and the interposer substrate; forming a hole through the encapsulant aligned over the interposer pad; and placing a conductive connector on and in direct contact with the interposer pad.

10 Claims, 3 Drawing Sheets

INTEGRATED CIRCUIT PACKAGING SYSTEM WITH MOLDED LASER VIA INTERPOSER AND METHOD OF MANUFACTURE THEREOF

CROSS-REFERENCE TO RELATED APPLICATION(S)

This is a divisional of co-pending U.S. patent application Ser. No. 13/162,566 filed Jun. 16, 2011, now U.S. Pat. No. 8,765,525.

TECHNICAL FIELD

The present invention relates generally to an integrated circuit packaging system, and more particularly to a system with molded via.

BACKGROUND ART

Current semiconductor packaging technology often involves tradeoffs between ease and efficiency of manufacturing on the one hand, and various performance drawbacks on the other. For example, a tremendous market growth for high density and high output/input integrated circuit packages has resulted in a trend for electronic products that are lightweight, smaller in size, multi-functional, and with ever increasing higher speeds. Electronic products such as cell phone base products, global positioning systems (GPS), satellites, communication equipment, consumer products, and a vast line of other similar products are in ever increasing global demand.

There is an important need that exists for parts in the package to become thinner and thinner to reduce the size of the whole package effectively without sacrificing performance and speed. Attempts have failed to provide a complete solution addressing simplified manufacturing processing, time to market, improved reliability, reduced electrical parts on the circuit boards, and size reductions of the circuit boards with increased functionality, leveragability, and increased product features to the consumer.

Thus, an increasing need remains to reduce parts mounted on the circuit boards while increasing functionality. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in art.

DISCLOSURE OF THE INVENTION

The present invention provides a method of manufacture of an integrated circuit packaging system including: providing a substrate; mounting an integrated circuit on the substrate; mounting an interposer substrate having an interposer pad on the integrated circuit; covering an encapsulant over the integrated circuit and the interposer substrate; forming a hole through the encapsulant aligned over the interposer pad; and placing a conductive connector on and in direct contact with the interposer pad.

The present invention provides an integrated circuit packaging system, including: a substrate; an integrated circuit on the substrate; an interposer substrate having an interposer pad on the integrated circuit; an encapsulant around the integrated circuit and the interposer substrate with a hole in the encapsulant aligned over the interposer pad; and a conductive connector on and in direct contact with the interposer pad.

Certain embodiments of the invention have other steps or elements in addition to or in place of those mentioned above. The steps or elements will become apparent to those skilled in art from a reading of the following detailed description when taken with reference to accompanying drawings.

BEST MODE FOR CARRYING OUT THE INVENTION

Figure 1:
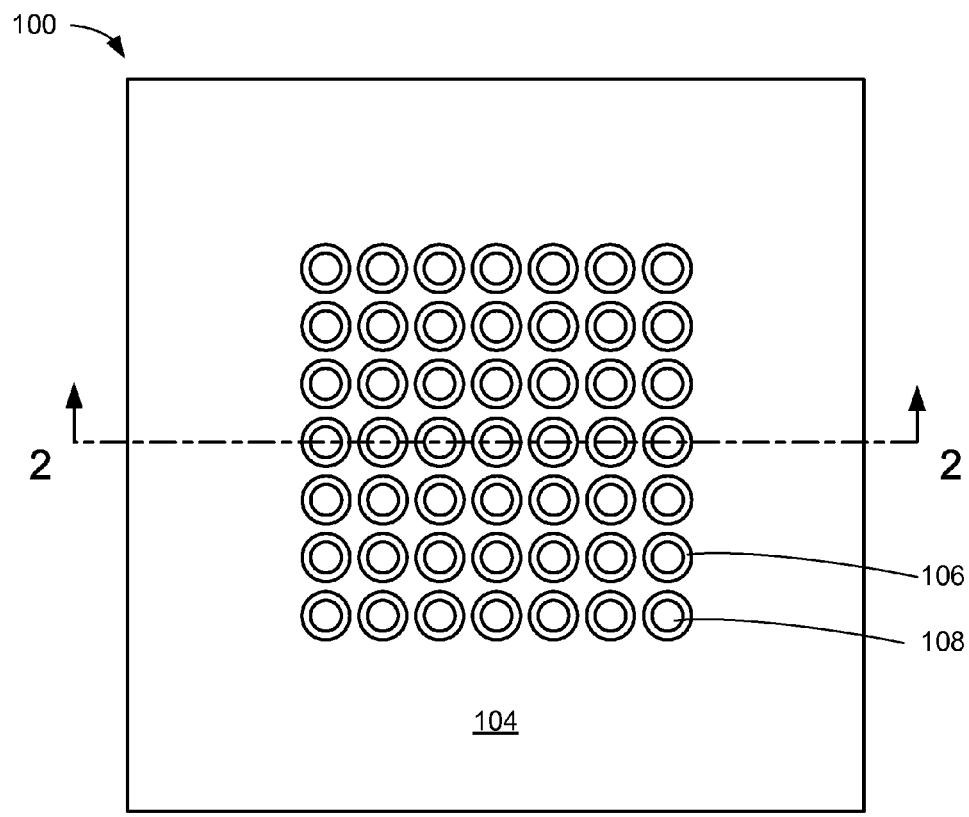
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of an integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

The term "package-on-package" ("PoP") as used herein includes packaging of devices, where each of the packages can be packaged and tested separately, and then stacked together in package form, wherein at least one package rests on top of another.

The term "Fan-In Package-on-Package" ("FiPoP") as used herein includes making connections between packages by means of a center ball array instead of a peripheral ball array, thereby decoupling the size of the top package from that of the bottom package.

Referring now to FIG. 1, therein is shown a top view of an integrated circuit packaging system 100 in a first embodiment of the present invention. The top view depicts the integrated circuit packaging system 100 having an encapsulant 104. The integrated circuit packaging system 100 can be in a PoP or a FiPoP configuration.

The encapsulant 104 is defined as a protective cover for the integrated circuit packaging system 100, such as a molding compound or an epoxy compound. The encapsulant 104 can include holes 106. The holes 106 are defined as partial apertures burned through the encapsulant 104 after an encapsulation process to expose an element encapsulated within the encapsulant 104. The holes 106 have characteristics of having been burned through with a laser, including burn marks, melt marks, carbon residues, or a combination thereof on surfaces immediately adjacent to the holes 106.

Conductive connectors 108 can be in the holes 106. The conductive connectors 108 are defined as an electrical conductive structure for providing electrical and mechanical connection to and from the integrated circuit packaging system 100. The conductive connectors 108 can be formed with a number of conductive materials such as solder, copper, or silver alloys for channeling electric power or signal between two sides of the holes 106. The conductive connectors 108 can be copper pillars. The conductive connectors 108 can be made with a planar top surface, such as by use of the copper pillars.

The conductive connectors 108 can have a spherical shape with a flat bottom. The conductive connectors 108 can also have an elliptical shape with a flat bottom. The conductive connectors 108 can be exposed from the encapsulant 104 above the encapsulant 104, co-planar with the encapsulant 104, or below the encapsulant 104 within the holes 106.

As an example, the encapsulant 104 can have a melting temperature below a melting temperature of the conductive connectors 108 before curing, such that the conductive connectors 108 do not melt from a mold temperature during encapsulation. The melting temperature of the encapsulant 104 can also be above the melting temperature of the conductive connectors 108.

Figure 2:
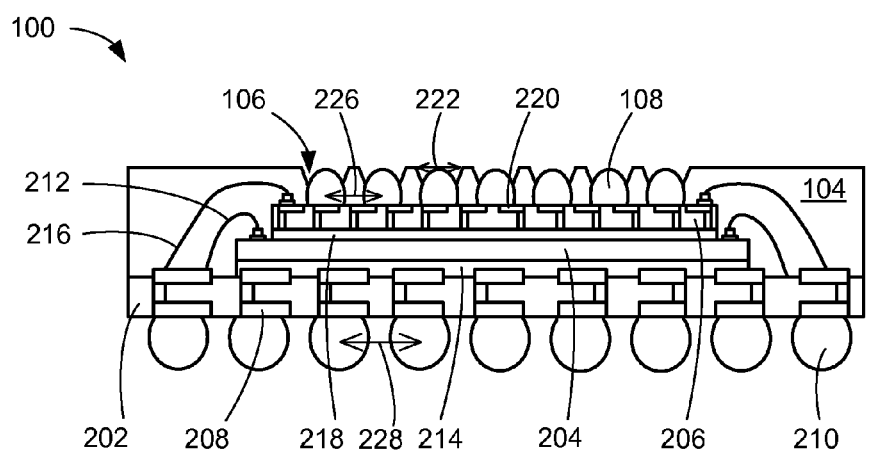
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The integrated circuit packaging system 100 can include a substrate 202, an integrated circuit 204, and an interposer substrate 206.

The substrate 202 is defined as a chip carrier, such as a laminated substrate or a ceramic substrate. The substrate 202 can be a chip carrier that is not entirely conductive. The substrate 202 can have contact pads 208 and external interconnects 210. The contact pads 208 are defined as conductive structures with a planar surface embedded within the substrate 202 for routing electric powers or signals through different areas of the substrate 202. The external interconnects 210 are defined as interconnects electrically connected to the substrate 202 via the contact pads 208 for electrically connecting other circuits (not shown) and electrical systems (not shown) to the integrated circuit packaging system 100.

The integrated circuit 204 can be mounted over the substrate 202. The integrated circuit 204 is defined as a device with functional circuitry thereon, such as an unpackaged die or a packaged electronic module. The integrated circuit 204 has device interconnects 212 for electrically connecting the integrated circuit 204 to the substrate 202. The device interconnects 212 are defined as conductive structures for electrically connecting the integrated circuit 204 to the substrate 202. The device interconnects 212 can be, for example, wires, bumps, or solder balls. For illustrative purposes, FIG. 2 shows the device interconnects 212 as wires connecting the integrated circuit 204 to the substrate 202.

The integrated circuit 204 can be attached to the substrate 202 with a first adhesive 214. The first adhesive 214 is defined as a material that attaches surfaces together. The first adhesive 214 can be, for example, a wire-in-film adhesive, an adhesive tape, an epoxy adhesive, or an underfill adhesive.

The interposer substrate 206 can be mounted over the integrated circuit 204. The interposer substrate 206 is defined as a substrate having conductive paths therein for making electrical connections between two sides of the substrate. The interposer substrate 206 can have interposer interconnects 216 for electrically connecting the interposer substrate 206 to the substrate 202. The interposer interconnects 216 are defined as conductive structures for electrically connecting the interposer substrate 206. The interposer interconnects 216 can be, for example, wires, bumps, or solder balls. For illustrative purposes, FIG. 2 shows the interposer interconnects 216 as wires.

The interposer substrate 206 can be attached to the integrated circuit 204 with a second adhesive 218. The second adhesive 218 is defined as a material that attaches surfaces together. The second adhesive 218 can be, for example, a wire-in-film adhesive, an adhesive tape, an epoxy adhesive, or an underfill adhesive.

The integrated circuit packaging system 100 can include the encapsulant 104. The encapsulant 104 can be applied to cover over the interposer substrate 206, the integrated circuit 204, and at least partially the substrate 202. As a specific example, the encapsulant 104 can completely encapsulate the integrated circuit 204 and expose at least one surface of the substrate 202. The encapsulant 104 can also completely encapsulate the interposer substrate 206. The encapsulant 104 can be molded to form a box-shape package having a planar top surface.

The holes 106 can be formed on the encapsulant 104. The holes 106 can be made using a laser or lasers to burn through the encapsulant 104. The holes 106 can be formed simultaneously from one laser or multiple lasers at different locations aligned over interposer pads 220 of the interposer substrate 206. The holes 106 can be formed with different depths or different sizes. The interposer pads 220 are defined as conductive structures embedded within the interposer substrate 206 with a planar surface for routing electrical powers and signals. Each of the holes 106 can have an opening area 222 with either decreasing or increasing value towards the interposer substrate 206.

The conductive connectors 108 can be used to fill the holes 106 on the interposer substrate 206. The conductive connectors 108 can fill the holes 106 such that a portion of the conductive connectors 108 is exposed from the encapsulant 104. The conductive connectors 108 can be in direct contact with the interposer substrate 206 and exposed from the encapsulant 104.

Alternatively, the conductive connectors 108 can be placed on the interposer substrate 206 aligned with the interposer pads 220 prior to encapsulation. The encapsulant 104 can cover the interposer substrate 206 along with the conductive connectors 108. The holes 106 can be formed through a top surface of the encapsulant 104 to expose the conductive connectors 108. The holes 106 can be formed with a laser through the encapsulant 104.

The conductive connectors 108 can be attached to the interposer substrate 206 before the interposer substrate 206 is attached to the integrated circuit 204. The conductive connectors 108 can also be attached on the interposer substrate 206 after the interposer is mounted to the integrated circuit 204.

It has been discovered that the conductive connectors 108 embedded within and in contact with the encapsulant 104 on the interposer substrate 206 provide a more stable and effective conductive connector mount reflow. The encapsulant 104 prevents the conductive connectors 108 from moving during a reflow process. Accordingly, the conductive connectors 108 embedded within and in contact with the encapsulant 104 on the interposer substrate 206 provide the present invention with a more stable and effective mount reflow process.

It has been unexpectedly found that the holes 106 allow the integrated circuit packaging system 100 to have the interposer substrate 206 having a top surface area smaller than the integrated circuit 204 and an interposer pitch 226 that is reduced. The interposer pitch 226 is defined as a distance between centers of immediately adjacent pairs of the conductive connectors 108. Having closely spaced vias formed from the conductive connectors 108 in the holes 106 allows for the interposer pitch 226 between instances of the conductive connectors 108 on the interposer substrate 206 to be reduced, for example, as compared to an external pitch 228. The external pitch is defined as a distance between centers of immediately adjacent pairs of the external interconnects 210 on the substrate 202. With reduced pitch and same number of the interposer pads 220, the interposer substrate 206 can have a top surface area smaller than a top surface area of the integrated circuit 204.

It has been discovered the integrated circuit packaging system 100 having the holes 106 and the conductive connectors 108 in the holes 106 in direct contact with the interposer substrate 206 provides the present invention with lower package profile and size. The conductive connectors 108 in the holes 106 of the encapsulant 104 create closely spaced vias that would otherwise be unfeasible if the interposer substrate 206 is exposed openly. The closely spaced vias provide protections against electrical shortages. Having the conductive connectors 108 in the holes 106 can provide enough closely spaced top input and output ("I/O") interconnections such that a spacer is not require to support an interposer that is larger than the integrated circuit 204 and such that the width of the package is smaller. Accordingly, the conductive connectors 108 in the holes 106 in direct with the interposer substrate 206 provide the present invention with lower package profile and size.

It has been discovered the integrated circuit packaging system 100 having the conductive connectors 108 in the holes 106 of the encapsulant 104 provides the present invention with warpage control and interconnect joint protection. Having the conductive connectors 108 in the holes 106 can provide protection to interconnect joints during warpage. Further, closely spacing the conductive connectors 108 in the holes 106 can reduce the warpage profile and hence further control the extent of warpage. Accordingly, the conductive connectors 108 in the holes 106 provide the present invention with warpage control and interconnect joint protection.

Figure 3:
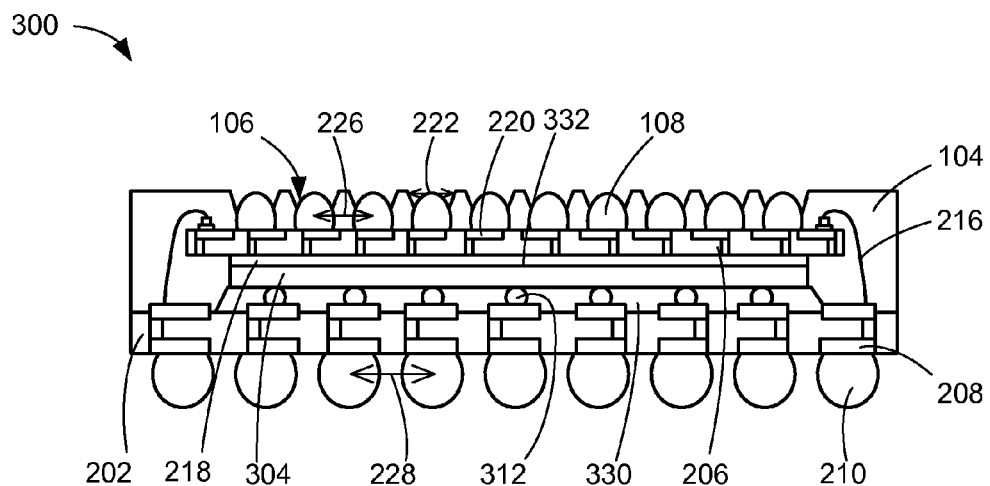
FIG. 3 is a cross-sectional view of an integrated circuit packaging system as exemplified by the top view of FIG. 1 along line 2-2 of FIG. 1 in a second embodiment of the present invention.

Referring now to FIG. 3, therein is shown a cross-sectional view of an integrated circuit packaging system 300 as exemplified by the top view of FIG. 1 along line 2-2 of FIG. 1 in a second embodiment of the present invention. The integrated circuit packaging system 300 can include the substrate 202, an integrated circuit 304, and the interposer substrate 206.

The substrate 202 is defined as a chip carrier, such as a laminated substrate or a ceramic substrate. The substrate 202 can be a chip carrier that is not entirely conductive. The substrate 202 can have the contact pads 208 and the external interconnects 210. The contact pads 208 are defined as conductive structures with a planar surface embedded within the substrate 202 for routing electric powers or signals through different areas of the substrate 202. The external interconnects 210 are defined as interconnects electrically connected to the substrate 202 via the contact pads 208 for electrically connecting other circuits (not shown) and electrical systems (not shown) to the integrated circuit packaging system 300.

The integrated circuit 304 can be mounted over the substrate 202. The integrated circuit 304 is defined as a device with functional circuitry thereon, such as an unpackaged die or a packaged electronic module. The integrated circuit 304 has device interconnects 312 for electrically connecting the integrated circuit 304 to the substrate 202. The device interconnects 312 are defined as conductive structures for electrically connecting the integrated circuit 304 to the substrate 202. For illustrative purposes, FIG. 3 shows the device interconnects 312 as conductive balls, such as solder balls or alloy balls, connecting the integrated circuit 304 to the substrate 202.

The integrated circuit 304 can be attached to the substrate 202 with an underfill 330. The underfill 330 is defined as a material that attaches surfaces together as well as protect the device interconnects 312 within the underfill 330. The underfill 330 can be, for example, an underfill adhesive, a snap cure underfill, a low profile underfill, or a reworkable underfill.

The interposer substrate 206 can be mounted over the integrated circuit 304 on a passive side 332 of the integrated circuit 304. The passive side 332 is defined as a side of an integrated circuit die where no active circuitry, such as a contact point or an output terminal, is exposed. The interposer substrate 206 is defined as a substrate having conductive paths therein for making electrical connections between two sides of the substrate. The interposer substrate 206 can have the interposer interconnects 216 for electrically connecting the interposer substrate 206 to the substrate 202. The interposer interconnects 216 are defined as conductive structures for electrically connecting the interposer substrate 206. The interposer interconnects 216 can be, for example, wires, bumps, or solder balls. For illustrative purposes, FIG. 3 shows the interposer interconnects 216 as wires.

The interposer substrate 206 can be attached to the integrated circuit 304 with the second adhesive 218. The second adhesive 218 is defined as a material that attaches surfaces together. The second adhesive 218 can be, for example, a wire-in-film adhesive, an adhesive tape, an epoxy adhesive, or an underfill adhesive.

The integrated circuit packaging system 300 can include the encapsulant 104. The encapsulant 104 can be applied to cover over the interposer substrate 206, the integrated circuit 304, and at least partially the substrate 202. As a specific example, the encapsulant 104 can completely encapsulate the integrated circuit 304 and expose at least one surface of the substrate 202. The encapsulant 104 can also completely encapsulate the interposer substrate 206. The encapsulant 104 can be molded to form a box-shape package having a planar top surface.

The holes 106 can be formed on the encapsulant 104. The holes 106 can be made using a laser or lasers to burn through the encapsulant 104. The holes 106 can be formed simultaneously from one laser or multiple lasers at different locations aligned over interposer pads 220 of the interposer substrate 206. The holes 106 can be formed with different depths or different sizes. The interposer pads 220 are defined as conductive structures embedded within the interposer substrate 206 with a planar surface for routing electrical powers and signals. Each of the holes 106 can have the opening area 222 with either decreasing or increasing value towards the interposer substrate 206.

The conductive connectors 108 can be used to fill the holes 106 on the interposer substrate 206. The conductive connectors 108 can fill the holes 106 such that a portion of the conductive connectors 108 is exposed from the encapsulant 104. The conductive connectors 108 can be in direct contact with the interposer substrate 206 and exposed from the encapsulant 104.

Alternatively, the conductive connectors 108 can be placed on the interposer substrate 206 aligned with the interposer pads 220 prior to encapsulation. The encapsulant 104 can cover the interposer substrate 206 along with the conductive connectors 108. The holes 106 can be formed through a top surface of the encapsulant 104 to expose the conductive connectors 108. The holes 106 can be formed with a laser through the encapsulant 104.

The conductive connectors 108 can be attached to the interposer substrate 206 before the interposer substrate 206 is attached to the integrated circuit 304. The conductive connectors 108 can also be attached on the interposer substrate 206 after the interposer is mounted to the integrated circuit 304.

It has been discovered that the conductive connectors 108 embedded within and in contact with the encapsulant 104 on the interposer substrate 206 provide a more stable and effective conductive connector mount reflow. The encapsulant 104 prevents the conductive connectors 108 from moving during a reflow process. Accordingly, the conductive connectors 108 embedded within and in contact with the encapsulant 104 on the interposer substrate 206 provide the present invention with a more stable and effective mount reflow process.

It has been unexpectedly found that the holes 106 allow the integrated circuit packaging system 300 to have the interposer substrate 206 having a top surface area smaller than the integrated circuit 304 and an interposer pitch 226 that is reduced. The interposer pitch 226 is defined as a distance between centers of immediately adjacent pairs of the conductive connectors 108. Having closely spaced vias formed from the conductive connectors 108 in the holes 106 allows for the interposer pitch 226 between instances of the conductive connectors 108 on the interposer substrate 206 to be reduced, for example, as compared to an external pitch 228. The external pitch is defined as a distance between centers of immediately adjacent pairs of the external interconnects 210 on the substrate 202. With reduced pitch and same number of the interposer pads 220, the interposer substrate 206 can have a top surface area smaller than a top surface area of the integrated circuit 304.

It has been discovered the integrated circuit packaging system 300 having the holes 106 and the conductive connectors 108 in the holes 106 in direct contact with the interposer substrate 206 provides the present invention with lower package profile and size. The conductive connectors 108 in the holes 106 of the encapsulant 104 create closely spaced vias that would otherwise be unfeasible if the interposer substrate 206 is exposed openly. The closely spaced vias provide protections against electrical shortages. Having the conductive connectors 108 in the holes 106 can provide enough closely spaced top input and output ("I/O") interconnections such that a spacer is not require to support an interposer that is larger than the integrated circuit 304 and such that the width of the package is smaller. Accordingly, the conductive connectors 108 in the holes 106 in direct with the interposer substrate 206 provides the present invention with lower package profile and size.

It has been discovered the integrated circuit packaging system 300 having the conductive connectors 108 in the holes 106 of the encapsulant 104 provides the present invention with warpage control and interconnect joint protection. Having the conductive connectors 108 in the holes 106 can provide protection to interconnect joints during warpage. Further, closely spacing the conductive connectors 108 in the holes 106 can reduce the warpage profile and hence further control the extent of warpage. Accordingly, the conductive connectors 108 in the holes 106 provide the present invention with warpage control and interconnect joint protection.

Figure 4:
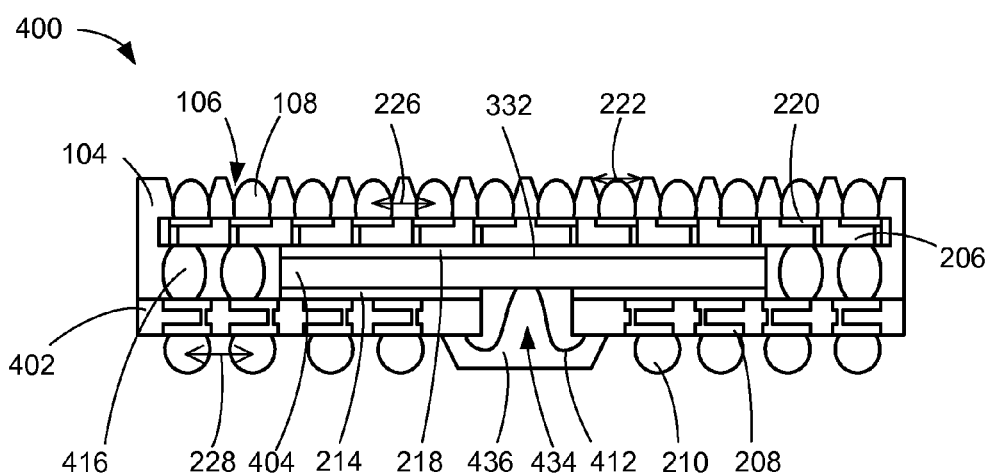
FIG. 4 is a cross-sectional view of an integrated circuit packaging system as exemplified by the top view of FIG. 1 along line 2-2 of FIG. 1 in a third embodiment of the present invention.

Referring now to FIG. 4, therein is shown a cross-sectional view of an integrated circuit packaging system 400 as exemplified by the top view of FIG. 1 along line 2-2 of FIG. 1 in a third embodiment of the present invention. The integrated circuit packaging system 400 can include a substrate 402, an integrated circuit 404, and the interposer substrate 206.

The substrate 402 is defined as a chip carrier, such as a laminated substrate or a ceramic substrate. The substrate 402 can be a chip carrier that is not entirely conductive. The substrate 402 can have the contact pads 208 and the external interconnects 210. The contact pads 208 are defined as conductive structures with a planar surface embedded within the substrate 402 for routing electric powers or signals through different areas of the substrate 402. The external interconnects 210 are defined as interconnects electrically connected to the substrate 402 via the contact pads 208 for electrically connecting other circuits (not shown) and electrical systems (not shown) to the integrated circuit packaging system 400. The substrate 402 can have a central cavity 434. The central cavity 434 is defined as an aperture in the substrate 402 for wiring interconnects through.

The integrated circuit 404 can be mounted over the substrate 402. The integrated circuit 404 is defined as a device with functional circuitry thereon, such as an unpackaged die or a packaged electronic module. The integrated circuit 404 has device interconnects 412 for electrically connecting the integrated circuit 404 to the substrate 402. The device interconnects 412 are defined as conductive structures for electrically connecting the integrated circuit 404 to the substrate 402. For illustrative purposes, FIG. 4 shows the device interconnects 412 as wires, such as gold wires or copper wires, connecting the integrated circuit 404 to the substrate 402 through the central cavity 434 of the substrate 402.

The integrated circuit 404 can be attached to the substrate 402 with the first adhesive 214. The first adhesive 214 is defined as a material that attaches surfaces together. The first adhesive 214 can be, for example, a wire-in-film adhesive, an adhesive tape, an epoxy adhesive, or an underfill adhesive.

The interposer substrate 206 can be mounted over the integrated circuit 404 on the passive side 332 of the integrated circuit 404. The passive side 332 is defined as a side of an integrated circuit die where no active circuitry, such as a contact point or an output terminal, is exposed. The interposer substrate 206 is defined as a substrate having conductive paths therein for making electrical connections between two sides of the substrate. The interposer substrate 206 can have interposer interconnects 416 for electrically connecting the interposer substrate 206 to the substrate 402. The interposer interconnects 416 are defined as conductive structures for electrically connecting the interposer substrate 206. For illustrative purposes, FIG. 4 shows the interposer interconnects 416 as conductive balls between the interposer substrate 206 and the substrate 402.

The interposer substrate 206 can be attached to the integrated circuit 404 with the second adhesive 218. The second adhesive 218 is defined as a material that attaches surfaces together. The second adhesive 218 can be, for example, a wire-in-film adhesive, an adhesive tape, an epoxy adhesive, or an underfill adhesive.

The integrated circuit packaging system 400 can include the encapsulant 104. The encapsulant 104 can be applied to cover over the interposer substrate 206, the integrated circuit 404, and at least partially the substrate 402. As a specific example, the encapsulant 104 can completely encapsulate the integrated circuit 404 and expose at least one surface of the substrate 402. The encapsulant 104 can also completely encapsulate the interposer substrate 206. The encapsulant 104 can be molded to form a box-shape package having a planar top surface.

The encapsulant 104 can include a protrusion 436. The protrusion 436 is a portion of the encapsulant 104 that fills the central cavity 434 of the substrate 402 and extends outside of the central cavity 434 underneath the substrate 402. The protrusion 436 can have a height lower than a height of the external interconnects 210.

The holes 106 can be formed on the encapsulant 104. The holes 106 can be made using a laser or lasers to burn through the encapsulant 104. The holes 106 can be formed simultaneously from one laser or multiple lasers at different locations aligned over interposer pads 220 of the interposer substrate 206. The holes 106 can be formed with different depths or different sizes. The interposer pads 220 are defined as conductive structures embedded within the interposer substrate 206 with a planar surface for routing electrical powers and signals. Each of the holes 106 can have the opening area 222 with either decreasing or increasing value towards the interposer substrate 206.

The conductive connectors 108 can be used to fill the holes 106 on the interposer substrate 206. The conductive connectors 108 can fill the holes 106 such that a portion of the conductive connectors 108 is exposed from the encapsulant 104. The conductive connectors 108 can be in direct contact with the interposer substrate 206 and exposed from the encapsulant 104.

Alternatively, the conductive connectors 108 can be placed on the interposer substrate 206 aligned with the interposer pads 220 prior to encapsulation. The encapsulant 104 can cover the interposer substrate 206 along with the conductive connectors 108. The holes 106 can be formed through a top surface of the encapsulant 104 to expose the conductive connectors 108. The holes 106 can be formed with a laser through the encapsulant 104. This can result in the conductive connectors 108 in the holes 106 and embedded in the encapsulant 104 such that the holes 106 are wider at the bottom than the middle due to the shape of the conductive connectors 108 and wider at the top than the middle due to the lasering process.

The conductive connectors 108 can be attached to the interposer substrate 206 before the interposer substrate 206 is attached to the integrated circuit 404. The conductive connectors 108 can also be attached on the interposer substrate 206 after the interposer is mounted to the integrated circuit 404.

It has been discovered that the conductive connectors 108 embedded within and in contact with the encapsulant 104 on the interposer substrate 206 provide a more stable and effective conductive connector mount reflow. The encapsulant 104 prevents the conductive connectors 108 from moving during a reflow process. Accordingly, the conductive connectors 108 embedded within and in contact with the encapsulant 104 on the interposer substrate 206 provide the present invention with a more stable and effective mount reflow process.

It has been unexpectedly found that the holes 106 allow the integrated circuit packaging system 400 to have the interposer substrate 206 having a top surface area smaller than the integrated circuit 404 and an interposer pitch 226 that is reduced. The interposer pitch 226 is defined as a distance between centers of immediately adjacent pairs of the conductive connectors 108. Having closely spaced vias formed from the conductive connectors 108 in the holes 106 allows for the interposer pitch 226 between instances of the conductive connectors 108 on the interposer substrate 206 to be reduced, for example, as compared to an external pitch 228. The external pitch is defined as a distance between centers of immediately adjacent pairs of the external interconnects 210 on the substrate 402. With reduced pitch and same number of the interposer pads 220, the interposer substrate 206 can have a top surface area smaller than a top surface area of the integrated circuit 404.

It has been discovered the integrated circuit packaging system 400 having the holes 106 and the conductive connectors 108 in the holes 106 in direct contact with the interposer substrate 206 provides the present invention with lower package size. The conductive connectors 108 in the holes 106 of the encapsulant 104 create closely spaced vias that would otherwise be unfeasible if the interposer substrate 206 is exposed openly. The closely spaced vias provide protections against electrical shortages. Having the conductive connectors 108 in the holes 106 can provide enough closely spaced top input and output ("I/O") interconnections such that the width of the package is smaller. Accordingly, the conductive connectors 108 in the holes 106 in direct with the interposer substrate 206 provide the present invention with lower package size.

It has been discovered the integrated circuit packaging system 400 having the conductive connectors 108 in the holes 106 of the encapsulant 104 provides the present invention with warpage control and interconnect joint protection. Having the conductive connectors 108 in the holes 106 can provide protection to interconnect joints during warpage. Further, closely spacing the conductive connectors 108 in the holes 106 can reduce the warpage profile and hence further control the extent of warpage. Accordingly, the conductive connectors 108 in the holes 106 provide the present invention with warpage control and interconnect joint protection.

Figure 5:
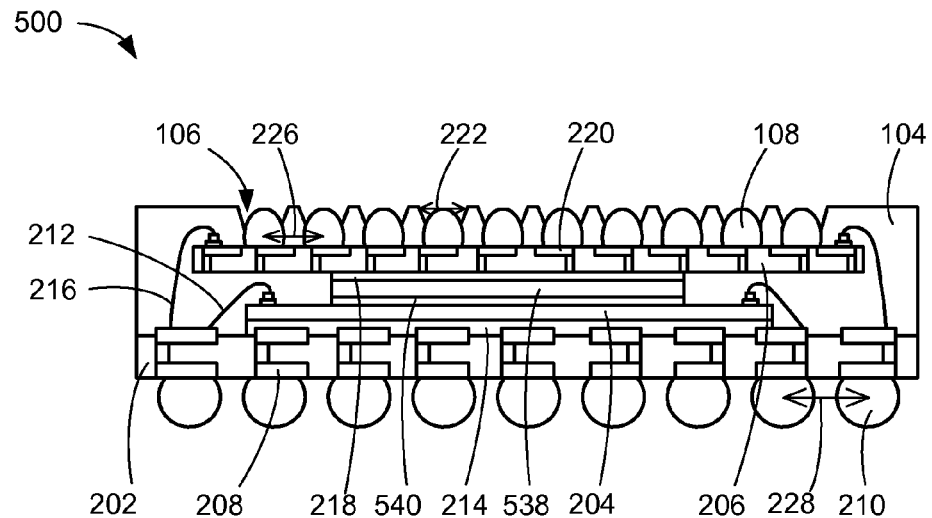
FIG. 5 is a cross-sectional view of an integrated circuit packaging system as exemplified by the top view of FIG. 1 along line 2-2 of FIG. 1 in a fourth embodiment of the present invention.

Referring now to FIG. 5, therein is shown a cross-sectional view of an integrated circuit packaging system 500 as exemplified by the top view of FIG. 1 along line 2-2 of FIG. 1 in a fourth embodiment of the present invention. The integrated circuit packaging system 500 can include the substrate 202, the integrated circuit 204, and the interposer substrate 206.

The substrate 202 is defined as a chip carrier, such as a laminated substrate or a ceramic substrate. The substrate 202 can be a chip carrier that is not entirely conductive. The substrate 202 can have the contact pads 208 and the external interconnects 210. The contact pads 208 are defined as conductive structures with a planar surface embedded within the substrate 202 for routing electric powers or signals through different areas of the substrate 202. The external interconnects 210 are defined as interconnects electrically connected to the substrate 202 via the contact pads 208 for electrically connecting other circuits (not shown) and electrical systems (not shown) to the integrated circuit packaging system 500.

The integrated circuit 204 can be mounted over the substrate 202. The integrated circuit 204 is defined as a device with functional circuitry thereon, such as an unpackaged die or a packaged electronic module. The integrated circuit 204 has the device interconnects 212 for electrically connecting the integrated circuit 204 to the substrate 202. The device interconnects 212 are defined as conductive structures for electrically connecting the integrated circuit 204 to the substrate 202. The device interconnects 212 can be, for example, wires, bumps, or solder balls. For illustrative purposes, FIG. 5 shows the device interconnects 212 as wires connecting the integrated circuit 204 to the substrate 202.

The integrated circuit 204 can be attached to the substrate 202 with the first adhesive 214. The first adhesive 214 is defined as a material that attaches surfaces together. The first adhesive 214 can be, for example, a wire-in-film adhesive, an adhesive tape, an epoxy adhesive, or an underfill adhesive.

A spacer 538 can be mounted over the integrated circuit 204. The spacer 538 is defined as a structural element for supporting and spacing another element to be mounted over the integrated circuit 204. The spacer 538 can be attached with a third adhesive 540. The third adhesive 540 is defined as a material that attaches surfaces together. The third adhesive 540 can be, for example, a wire-in-film adhesive, an adhesive tape, an epoxy adhesive, or an underfill adhesive.

The interposer substrate 206 can be mounted over the spacer 538. The interposer substrate 206 is defined as a substrate having conductive paths therein for making electrical connections between two sides of the substrate. The interposer substrate 206 can have the interposer interconnects 216 for electrically connecting the interposer substrate 206 to the substrate 202. The interposer interconnects 216 are defined as conductive structures for electrically connecting the interposer substrate 206. The interposer interconnects 216 can be, for example, wires, bumps, or solder balls. For illustrative purposes, FIG. 5 shows the interposer interconnects 216 as wires.

The interposer substrate 206 can be attached to the spacer 538 with the second adhesive 218. The second adhesive 218 is defined as a material that attaches surfaces together. The second adhesive 218 can be, for example, a wire-in-film adhesive, an adhesive tape, an epoxy adhesive, or an underfill adhesive.

The integrated circuit packaging system 500 can include the encapsulant 104. The encapsulant 104 can be applied to cover over the interposer substrate 206, the integrated circuit 204, and at least partially the substrate 202. As a specific example, the encapsulant 104 can completely encapsulate the integrated circuit 204 and expose at least one surface of the substrate 202. The encapsulant 104 can also completely encapsulate the interposer substrate 206. The encapsulant 104 can be molded to form a box-shape package having a planar top surface.

The holes 106 can be formed on the encapsulant 104. The holes 106 can be made using a laser or lasers to burn through the encapsulant 104. The holes 106 can be formed simultaneously from one laser or multiple lasers at different locations aligned over interposer pads 220 of the interposer substrate 206. The holes 106 can be formed with different depths or different sizes. The interposer pads 220 are defined as conductive structures embedded within the interposer substrate 206 with a planar surface for routing electrical powers and signals. Each of the holes 106 can have the opening area 222 with either decreasing or increasing value towards the interposer substrate 206.

The conductive connectors 108 can be used to fill the holes 106 on the interposer substrate 206. The conductive connectors 108 can fill the holes 106 such that a portion of the conductive connectors 108 is exposed from the encapsulant 104. The conductive connectors 108 can be in direct contact with the interposer substrate 206 and exposed from the encapsulant 104.

Alternatively, the conductive connectors 108 can be placed on the interposer substrate 206 aligned with the interposer pads 220 prior to encapsulation. The encapsulant 104 can cover the interposer substrate 206 along with the conductive connectors 108. The holes 106 can be formed through a top surface of the encapsulant 104 to expose the conductive connectors 108. The holes 106 can be formed with a laser through the encapsulant 104.

The conductive connectors 108 can be attached to the interposer substrate 206 before the interposer substrate 206 is attached to the integrated circuit 204. The conductive connectors 108 can also be attached on the interposer substrate 206 after the interposer is mounted to the integrated circuit 204.

It has been discovered that the conductive connectors 108 embedded within and in contact with the encapsulant 104 on the interposer substrate 206 provide a more stable and effective conductive connector mount reflow. The encapsulant 104 prevents the conductive connectors 108 from moving during a reflow process. Accordingly, the conductive connectors 108 embedded within and in contact with the encapsulant 104 on the interposer substrate 206 provide the present invention with a more stable and effective mount reflow process.

It has been unexpectedly found that the holes 106 allow the integrated circuit packaging system 500 to have the interposer substrate 206 having a top surface area smaller than the integrated circuit 204 and an interposer pitch 226 that is reduced. The interposer pitch 226 is defined as a distance between centers of immediately adjacent pairs of the conductive connectors 108. Having closely spaced vias formed from the conductive connectors 108 in the holes 106 allows for the interposer pitch 226 between instances of the conductive connectors 108 on the interposer substrate 206 to be reduced, for example, as compared to an external pitch 228. The external pitch is defined as a distance between centers of immediately adjacent pairs of the external interconnects 210 on the substrate 202. With reduced pitch and same number of the interposer pads 220, the interposer substrate 206 can have a top surface area smaller than a top surface area of the integrated circuit 204.

It has been discovered the integrated circuit packaging system 500 having the holes 106 and the conductive connectors 108 in the holes 106 in direct contact with the interposer substrate 206 provides the present invention with lower package profile and size. The conductive connectors 108 in the holes 106 of the encapsulant 104 create closely spaced vias that would otherwise be unfeasible if the interposer substrate 206 is exposed openly. The closely spaced vias provide protections against electrical shortages. Having the conductive connectors 108 in the holes 106 can provide enough closely spaced top input and output ("I/O") interconnections such that a spacer is not require to support an interposer that is larger than the integrated circuit 204 and such that the width of the package is smaller. Accordingly, the conductive connectors 108 in the holes 106 in direct with the interposer substrate 206 provide the present invention with lower package profile and size.

It has been discovered the integrated circuit packaging system 500 having the conductive connectors 108 in the holes 106 of the encapsulant 104 provides the present invention with warpage control and interconnect joint protection. Having the conductive connectors 108 in the holes 106 can provide protection to interconnect joints during warpage. Further, closely spacing the conductive connectors 108 in the holes 106 can reduce the warpage profile and hence further control the extent of warpage. Accordingly, the conductive connectors 108 in the holes 106 provide the present invention with warpage control and interconnect joint protection.

Figure 6:
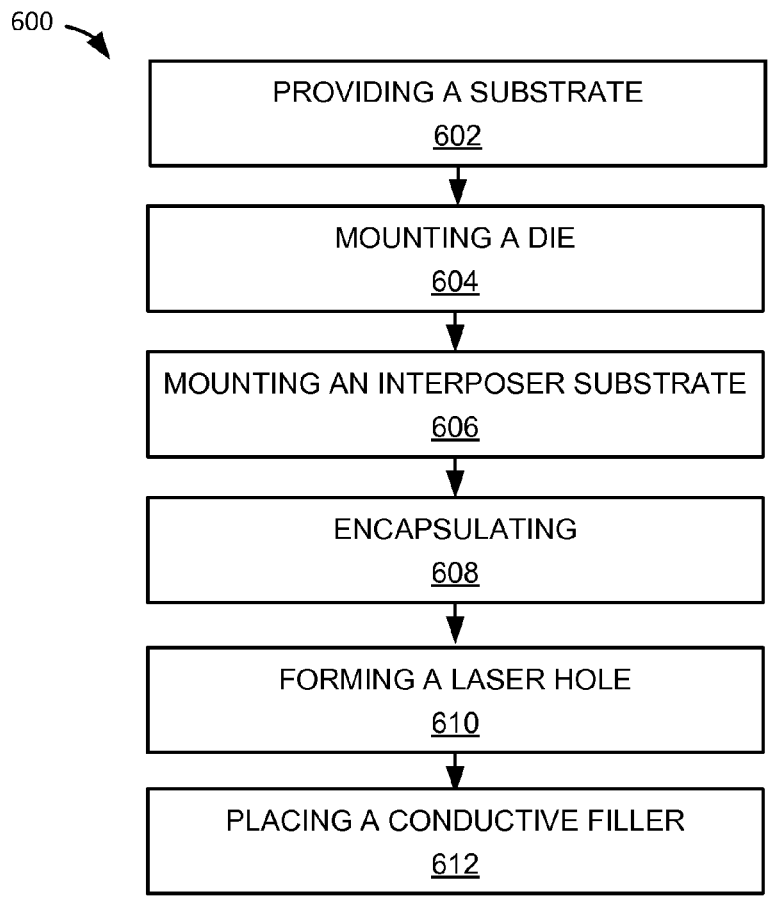
FIG. 6 therein is a flow chart of a method of manufacture of the integrated circuit packaging system in a further embodiment of the present invention.

Referring now to FIG. 6 therein is shown a flow chart of a method 600 of manufacture of the integrated circuit packaging system 100 in a further embodiment of the present invention. The method 600 includes: providing a substrate, in a block 602; mounting an integrated circuit on the substrate, in a block 604; mounting an interposer substrate having an interposer pad on the integrated circuit, in a block 606; covering an encapsulant over the integrated circuit and the interposer substrate, in a block 608; forming a hole through the encapsulant aligned over the interposer pad, in a block 610; and placing a conductive connector on and in direct contact with the interposer pad, in a block 612.

The resulting method, process, apparatus, device, product, and system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in art in light of aforegoing description. Accordingly, it is intended to embrace all such alternatives, modifications, and variations that fall within the scope of the included claims. All matters hithertofore set forth herein or shown in accompanying drawings are to be interpreted in an illustrative and non-limiting sense.

What is claimed is:

1. An integrated circuit packaging system comprising:
   a substrate;
   an integrated circuit on the substrate;
   an interposer substrate having interposer pads on the integrated circuit;
   an encapsulant around the integrated circuit and the interposer substrate with holes in the encapsulant aligned over the interposer pads, the holes being wider at the bottom and top of the holes than the middle of the holes; and
   a conductive connector on and in direct contact with the interposer pads, in the holes in the encapsulant, and embedded in the encapsulant.

2. The integrated circuit packaging system as claimed in claim 1 wherein the interposer substrate has a top surface area smaller than a top surface area of the integrated circuit.

3. The integrated circuit packaging system as claimed in claim 1 wherein the conductive connector has a portion exposed above the encapsulant.

4. The integrated circuit packaging system as claimed in claim 1 wherein the holes in the encapsulant have different sizes.

5. The integrated circuit packaging system as claimed in claim 1 wherein the encapsulant with the holes has characteristics of having been burned through including burn marks, melt marks, carbon residue, or a combination thereof on surfaces immediately adjacent to the holes.

6. The integrated circuit packaging system as claimed in claim 1 wherein:
   the holes having different sizes are formed by lasering through the encapsulant simultaneously at different locations.

7. The integrated circuit packaging system as claimed in claim 6 wherein:
   the substrate has external interconnects; and
   the conductive connector has an interposer pitch between the conductive connector and a further conductive connector immediately adjacent to the conductive connector less than an external pitch between immediately adjacent pairs of external interconnects on the substrate.

8. The integrated circuit packaging system as claimed in claim 6 further comprising a spacer on the integrated circuit for supporting the interposer substrate.

9. The integrated circuit packaging system as claimed in claim 6 wherein the substrate has a central cavity.

10. The integrated circuit packaging system as claimed in claim 6 wherein the interposer substrate is on a passive side of the integrated circuit.

\* \* \* \* \*